United States Patent
Yi et al.

(10) Patent No.: US 8,405,431 B2
(45) Date of Patent: Mar. 26, 2013

(54) LINE DRIVER

(75) Inventors: Bin-Wei Yi, Taichung (TW);
Hao-Chang Chang, Taipei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 103 days.

(21) Appl. No.: 13/186,452

(22) Filed: Jul. 19, 2011

(65) Prior Publication Data
US 2012/0235711 A1    Sep. 20, 2012

(30) Foreign Application Priority Data

Mar. 18, 2011  (TW) .............................. 100109394 A

(51) Int. Cl.
*H03K 5/12*    (2006.01)
(52) U.S. Cl. ........................................................ 327/108
(58) Field of Classification Search .................. 327/108, 327/112
See application file for complete search history.

(56) References Cited

U.S. PATENT DOCUMENTS

| 5,936,393 A | 8/1999 | Nauta | |
| 6,949,963 B2 * | 9/2005 | De Haas et al. | 327/108 |
| 8,022,736 B2 * | 9/2011 | Chang et al. | 327/108 |

OTHER PUBLICATIONS

Narayan Prasad R. et al., "An Adaptive Analog Video Line Driver With Impedance Matching Based on Peak Detection," Circuits and Systems, 2002 IEEE International Symposium, pp. IV-273-IV276, vol. 4 , May 2002.

* cited by examiner

*Primary Examiner* — Hai L Nguyen
(74) *Attorney, Agent, or Firm* — Jianq Chyun IP Office

(57) ABSTRACT

A line driver includes the following. A current replication unit replicates a reference current according to an input signal. A current mapping unit adjusts a number of P channel transistors connected in parallel and inside the current mapping unit according to control information, so as to amplify the reference current according to a magnification value. A first resistor is electrically connected between the current replication unit and a direct-current voltage. A second resistor is electrically connected to the current replication unit and the current mapping unit and generates an output signal. A signal detection unit performs integration on a part of a difference between the input signal and the output signal, thereby generating an integration signal. A magnification control unit gradually adjusts magnification information related to a reference signal, and updates the control information by the magnification information when the reference signal is equal to the integration signal.

9 Claims, 6 Drawing Sheets

LINE DRIVER

CROSS-REFERENCE TO RELATED APPLICATION

This application claims the priority benefit of Taiwan application serial no. 100109394, filed on Mar. 18, 2011. The entirety of the above-mentioned patent application is hereby incorporated by reference herein and made a part of this specification.

BACKGROUND OF THE INVENTION

1. Technical Field

The disclosure is related to a type of line driver, and in particular to a type of line driver which adaptively adjusts an output impedance.

2. Background

FIG. 1 is a schematic diagram of a front-end circuit of a conventional transmitter. Referring to FIG. 1, during a process of transmitting signals, a digital to analog converter 110 converts a digital signal DS1 from a digital system into an analog signal AS1. Next, a line driver 120 transmits the signal AS1 to a transmission line 130. Two types of impedance exist at the junction between the line driver 120 and the transmission line 130: one is an output impedance Ro1 of the line driver 120, and the other is an equivalent impedance Zin1 formed by a characteristic impedance of the transmission line 130 and a load resistor R1.

FIGS. 2A and 2B are each a schematic diagram showing transmission of signals. As shown in FIG. 2A, when the output impedance Ro1 and the impedance Zin1 are not equal, an output signal ST21 of the line driver 120 induces a great reflection signal SR21. At this moment, the output signal ST21 is interfered by the reflection signal SR21, so that efficiency of the transmission system is reduced. On the other hand, as shown in FIG. 2B, when the output impedance Ro1 and the impedance Zin1 are approximately equal, i.e. impedance matching, a reflection signal SR22 is far less than the output signal ST21. At this moment, the output signal ST21 is affected by the reflection signal SR22 to a limited extent, so that the efficiency of the transmission system is barely affected. In other words, impedance matching between the line driver 120 and the transmission line 130 directly affects the quality of signal transmission.

In order to enhance the stability and efficiency of a transmission system, U.S. Pat. No. 5,936,393 discloses a type of "Analog Line Driver with Adaptive Impedance Matching." In this patent, a line driver utilizes an integrator to perform integration on a whole signal and utilizes a voltage obtained by integration to adjust a voltage on a resistor. Thus, as the voltage on the resistor changes, the output impedance of the line driver changes accordingly. However, since integration is performed on the whole signal in this patent, this technology cannot be applied to a system which has a fixed direct-current voltage. Moreover, errors during manufacturing of the resistor cause serious distortion of greater output signals, thereby affecting quality of signal transmission.

Furthermore, in 2002, the Institute of Electrical and Electronic Engineers (IEEE) published the article "An adaptive analog video line driver with impedance matching based on peak detector" in pages 273-276 of volume 4 of the journal Circuits and Systems. This publication discloses using two peak detectors to detect a difference between signal amplitudes and using a detection result to adjust a current that flows through a resistor, thereby changing an output impedance of a line driver accordingly. However, this method requires extra hardware costs for the system, and the disposed resistor causes serious distortion of greater output signals.

SUMMARY OF THE INVENTION

The disclosure provides a line driver which changes a magnification value of a driving current and a reference current by adjusting a number of P channel transistors connected in parallel and inside a current mapping unit. Therefore, the line driver is able to adaptively adjust an output impedance thereof, thereby avoiding distortion of greater signals.

The disclosure provides a line driver which includes a current replication unit, a current mapping unit, a first resistor, a second resistor, a signal detection unit, and a magnification control unit. The current replication unit replicates a reference current according to an input signal. The current mapping unit is electrically connected to the current replication unit and includes a plurality of first P channel transistors. Moreover, the current mapping unit adjusts a number of the first P channel transistors inside and connected in parallel according to control information, so as to amplify the reference current according to a magnification value and generate a driving current.

On the other hand, the first resistor is electrically connected between the current replication unit and a direct-current voltage, so as to determine the reference current. The second resistor is electrically connected to the current replication unit and the current mapping unit, so as to generate an output signal. The signal detection unit performs integration on a part of a difference between the input signal and the output signal, so as to generate an integration signal. The magnification control unit generates the control information and gradually adjusts magnification information related to a reference signal, so that the reference signal and the integration signal are equal. Furthermore, when the reference signal and the integration signal are equal, the magnification control unit updates the control information by the magnification information, so as to adjust the number of the first P channel transistors connected in parallel.

According to an embodiment of the disclosure, the current mapping unit further includes a plurality of first switches. A first end of each of the first switches is electrically connected to the current replication unit, a second end of the i-th first switch is electrically connected to a gate of the i-th first P channel transistor, and i is a positive integer. Moreover, the first switch determines an on or off state thereof according to the control information. On the other hand, a source of each of the first P channel transistors is electrically connected to a power source voltage, and a drain of each of the first P channel transistors is electrically connected to the second resistor.

According to an embodiment of the disclosure, the signal detection unit includes a signal capturer and a difference integration circuit. The signal capturer captures a part of the input signal and a part of the output signal and generates an input segment signal and an output segment signal. Moreover, in a first time interval, the difference integration circuit performs integration on a difference between the input segment signal and the output segment signal. Moreover, in a second time interval, the difference integration circuit stops performing integration and outputs accordingly the integration signal.

According to an embodiment of the disclosure, the magnification control unit includes a comparator, a signal converter, and a signal generator. The comparator receives the integration signal and the reference signal and generates accordingly a comparison signal. The signal generator is electrically connected to the comparator and generates the reference signal according to the magnification information. The signal converter is electrically connected to the comparator and the signal generator and generates the control information. Furthermore, the signal converter determines the magnification information according to the comparison signal and gradually adjusts the magnification information through binary successive approximation. Therefore, when the reference signal and the integration signal are equal, the signal converter updates the control information by the magnification information.

According to an embodiment of the disclosure, in the first time interval, the signal detection unit performs integration on a part of a difference between the input signal and the output signal, and in the second time interval, the signal detection unit stops performing integration and outputs the integration signal to the magnification control unit. In addition, in the first time interval, the magnification control circuit stops adjusting the reference signal, and in the second time interval, the reference signal is adjusted to the integration signal.

In summary, the instant application uses the control information to adjust the number of the P channel transistors which are connected in parallel and inside the current mapping unit, so as to change the magnification value of the driving current and the reference current. By changing the magnification number, the line driver is able to adaptively adjust the output impedance thereof. Furthermore, since according to the disclosure, adjustment of the current does not require resistors, a greater output signal is permitted. On the other hand, in terms of controlling the magnification value of the current, according to the disclosure, integration is performed on a part of the difference between the input signal and the output signal, and the magnification value is adjusted according to the integration signal obtained through integration. Therefore, the line driver is able to be applied to a system in which a direct-current voltage of a signal is fixed.

In order to make the aforementioned and other objects, features and advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
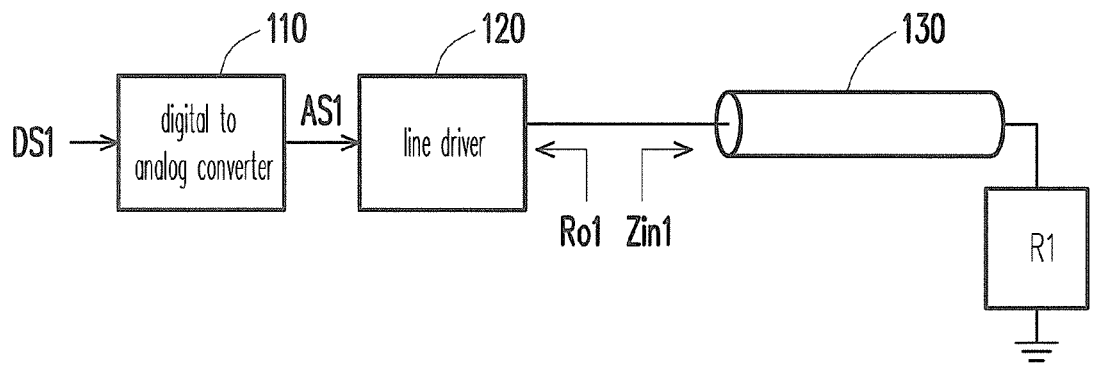
FIG. 1 is a schematic diagram of a front-end circuit of a conventional transmitter.
Figure 2A:
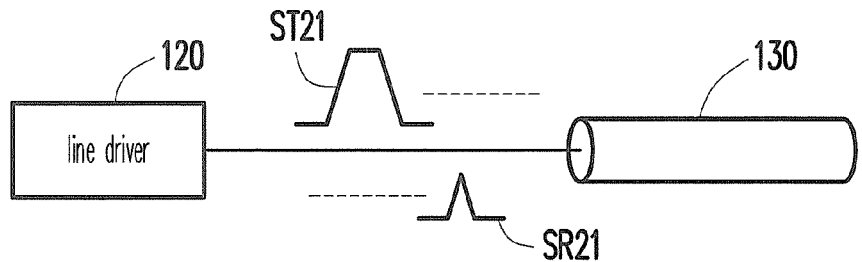
FIGS. 2A and 2B are each a schematic diagram showing transmission of signals.
Figure 2B:
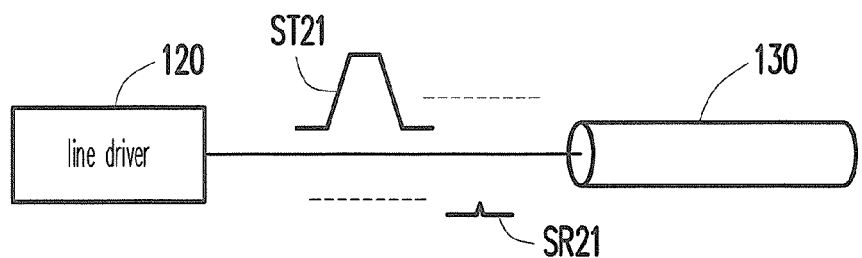
Figure 3:
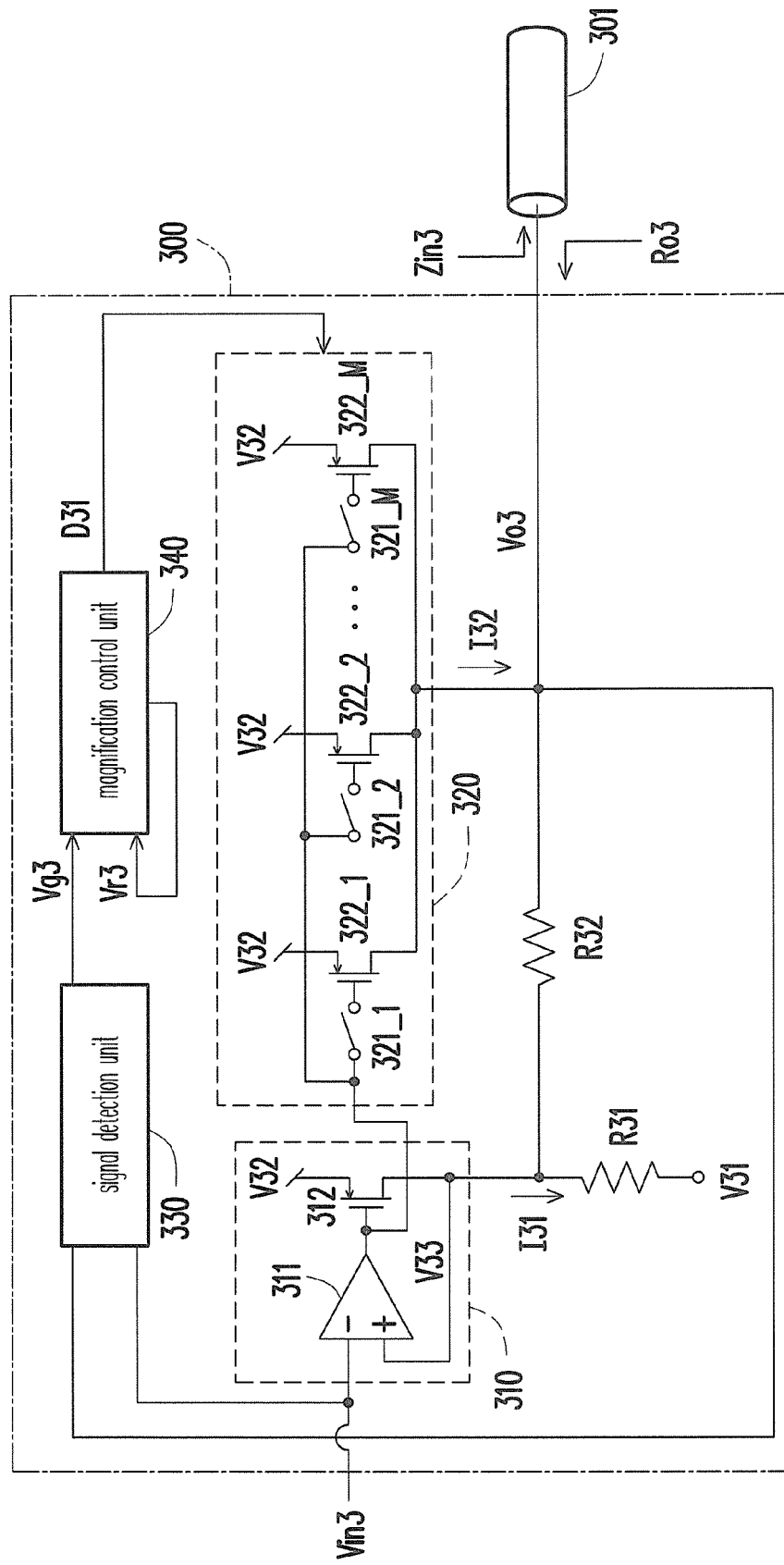
FIG. 3 is a schematic block diagram of a line driver according to an embodiment of the disclosure.

FIG. 3 is a schematic block diagram of a line driver according to an embodiment of the disclosure. Referring to FIG. 3, a line driver 300 is used to drive a transmission line 301. Two types of impedance exist at a junction between the line driver 300 and the transmission line 301: one is an output impedance Ro3 of the line driver 300, and the other is an equivalent impedance Zin3 formed by the transmission line 301 and a load (not shown). Operationally, the line driver adaptively adjusts the output impedance Ro3 according to changes in the equivalent impedance Zin3, so as to achieve impedance matching.

Still referring to FIG. 3, the line driver 300 includes a current replication unit 310, a current mapping unit 320, a signal detection unit 330, a magnification control unit 340, and resistors R31 and R32. The current replication unit 310 replicates a reference current I31 according to an input signal Vin3. Moreover, the current mapping unit 320 is electrically connected to the current replication unit 310 and magnifies the reference current I31 according to a magnification value (N). Thus, the current mapping unit 320 is able to generate a driving current I32, and I32=N*I31. Moreover, a first end of the resistor R31 is electrically connected to the current replication unit 310, and a second end of the resistor R31 is electrically connected to a direct-current voltage V31. A first end of the resistor R32 is electrically connected to the current replication unit 310, and a second end of the resistor R32 is electrically connected to the current mapping unit 320.

During actual operation, when the output signal Vo3 and the input signal Vin3 are equal, the output impedance Ro3 of the line driver 300 and the equivalent impedance Zin3 match, so that the whole system is in a stable state. Moreover, in the circuit structure of the line driver 300, since a signal at the first end of the resistor R32 is equal to the input signal Vin3 are, and a signal at the second end of the resistor R32 is the output signal Vo3, when the resistor R31 is configured as N times the equivalent impedance Zin3, i.e. when R31=N*Zin3, the output signal Vo3 and the input signal Vin3 are equal.

However, a material, coiling method, and outside environment of the transmission line 301 all affect characteristic impedance thereof, so that the equivalent impedance Zin3 formed by the transmission line 301 and the load changes. In order to ensure that R31=N*Zin3, when the equivalent impedance Zin3 is less than expected, the current mapping unit 320 increases the magnification value (N) according to a control information D31, so as to achieve impedance matching. Moreover, when the equivalent impedance Zin3 is greater than expected, the current mapping unit 320 decreases the magnification value (N) according to the control information D31, so as to achieve impedance matching.

On the other hand, according to the present embodiment, the control information D31 is adjusted through the signal detection unit 330 and the magnification control unit 340. The signal detection unit 330 performs integration on a part of a difference between the input signal Vin3 and the output signal Vo3, so as to generate an integration signal Vg3. In addition, the magnification control circuit 340 gradually adjusts magnification information related to a reference signal Vr3, so that the reference signal Vr3 and the integration signal Vg3 are equal. Furthermore, the magnification control unit 340 generates the control information D31, and updates the control information D31 by the magnification information when the reference signal Vr3 and the integration signal Vg3 are equal.

Therefore, when the equivalent impedance Zin3 is less than expected, the output signal Vo3 is less than the input signal Vin3. At this moment, the integration signal Vg3 generated by the signal detection unit 330 increases, so that the value of the control information D31 transmitted back by the magnification control unit 340 also increases. Hence, the current mapping unit 320 is able to increase the magnification value (N) according to the control information D31. On the other hand, when the equivalent impedance Zin3 is greater than expected, the output signal Vo3 is greater than the input signal Vin3. At this moment, the integration signal Vg3 generated by the signal detection unit 330 decreases, so that the value of the control information D31 transmitted back by the magnification control unit 340 also decreases. Hence, the current mapping unit 320 is able to decrease the magnification value (N) according to the control information D31.

In further detail, according to the present embodiment, the current replication unit 310 includes an operational amplifier 311 and a P channel transistor 312. A negative input end of the operational amplifier 311 receives the input signal Vin3. A source of the P channel transistor 312 is electrically connected to a power source voltage V32, a gate of the P channel transistor 312 is electrically connected to an output end of the operational amplifier 311, and a drain of the P channel transistor 312 is electrically connected to a positive input end of the operation amplifier 311 and the first end of the resistor R31. Operationally, since the two input ends of the operational amplifier 311 are virtually grounded, a drain voltage V33 of the P channel transistor 312 and the input signal Vin3 are equal. Therefore, the current replication unit 310 is able to replicate the reference current I31 according to the input signal Vin3.

Furthermore, the current mapping unit 320 includes a plurality of switches 321_1-321_M and a plurality of P channel transistors 322_1-322_M. A first end of each of the switches 321_1-321_M is electrically connected to the current replication unit 310. In addition, a second end of the switch 321_1 is electrically connected to a gate of the P channel transistor 322_1, and a second end of the switch 321_2 is electrically connect to a gate of the P channel transistor 322_2. The rest of the switches and the P channel transistors are connected in the same manner. Moreover, a source of each of the P channel transistors 322_-322_M is electrically connected to a power source voltage V32, and a drain of each of the P channel transistors 322_1-322_M is electrically connected to the second end of the resistor R32.

Operationally, each of the switches 322_1-322_M individually controls its on or off state between the first end and the second end thereof according to the control information D31. Hence, a number of the P channel transistors 322_1-322_M connected in parallel is changed accordingly, so that the current mapping unit 320 amplifies the reference current I31 according to different magnification values (N). For example, if the control information is 4-bit $\{D_4D_3D_2D_1\}$, four switches 321_1-321_4 and four P channel transistors 322_1-322_4 are correspondingly disposed in the current mapping unit 320. Moreover, each of the bits in the control information D31 is used to control a corresponding switch. For example, the bit $D_4$ is used to control the on or off state of the switch 321_4, and the bit $D_3$ is used to control the on or off state of the switch 321_3. The remaining bits and switches are configured in the same manner.

Furthermore, according to the present embodiment, layout areas of the P channel transistors 322_1-322_4 increase in a power of 2, and the layout area of the P channel transistor 322_1 and a layout area of the P channel transistor 312 in the current replication unit 310 are equal. In other words, the layout areas of the P channel transistors 322_1-322_4 are respectively 1, 2, 4, and 8 times the layout area of the P channel transistor 312. Therefore, when the control information D31 is {0010}, the switch 321_2 is on, and the switches 321_1, 321_3, and 321_4 are off. Hence, the driving current I32 generated by the current mapping unit 320 at this moment is 2 times the reference current I31. Similarly, when the control information D31 is {1010}, the driving current I32 generated by the current mapping unit 320 is 10 times the reference current I31. In other words, the magnification value (N) of the current mapping unit 320 changes according to the value of the control information D31. It should be noted that although the present embodiment describes the layout areas of the P channel transistors, the disclosure is not limited to this configuration. In an actual layout, one of ordinary skill in the art may also change the ratios of the layout areas of the P channel transistors 322_1 and 312, so that the magnification value (N) is adjustable between decimals and integers.

Figure 4:
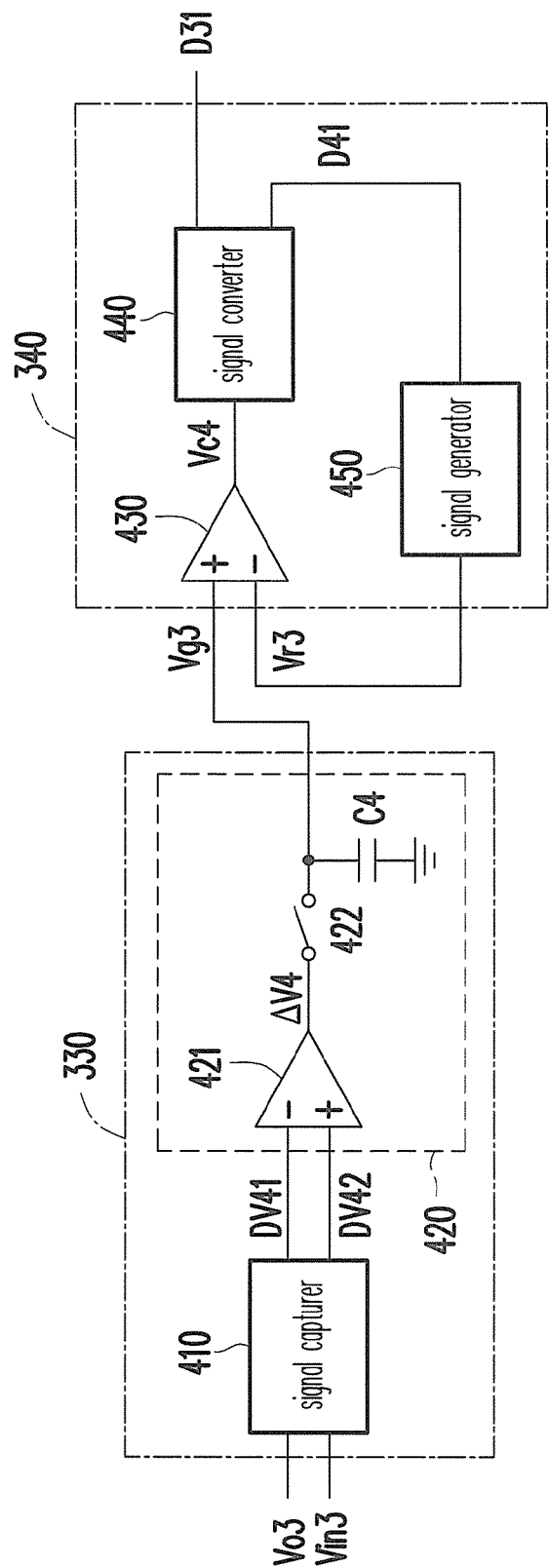
FIG. 4 is a schematic circuit diagram of a signal detection unit and a magnification control unit according to an embodiment of the disclosure.

In order that one of ordinary skill in the art further understands the disclosure, FIG. 4 is a schematic circuit diagram of a signal detection unit and a magnification control unit according to an embodiment of the disclosure. Referring to FIG. 4, the signal detection unit 330 includes a signal capturer 410 and a difference integration circuit 420, and the difference integration circuit 420 includes an error amplifier 421, a switch 422, and a capacitor C4. The signal capturer 410 captures a part of the input signal Vin3 and a part of the output signal Vo3 and generates accordingly an input segment signal DV41 and an output segment signal DV42.

Moreover, a positive input end of the error amplifier 421 receives the input segment signal DV41, and a negative input end of the error amplifier 421 receives the output segment signal DV42. Therefore, the error amplifier 421 generates accordingly a difference $\Delta V4$ between the input segment signal DV41 and the output segment signal DV42. Furthermore, the first end of the switch 422 is electrically connected to the output end of the error amplifier 421. A first end of the capacitor C4 is electrically connected to the second end of the switch 422, and a second end of the capacitor C4 is electrically connected to a ground voltage. Hence, when the first end and second end of the switch 422 are turned on, the error amplifier 421 and the capacitor C4 form an integration circuit, so as to perform integration on the difference $\Delta V4$ is. On the other hand, when the first end and second end of the switch 422 are turned off, the difference $\Delta V4$ stored in the capacitor C4 is supplied to the magnification control circuit 340 at the back end.

Still referring to FIG. 4, the magnification control unit 340 includes a comparator 430, a signal converter 440, and a signal generator 450. The comparator 430 is electrically connected to the signal detection unit 330 and the signal generator 450. In addition, the signal converter 440 is electrically connected to the signal generator 450 and the current mapping unit 320.

Operationally, the signal generator 450 generates the corresponding reference signal Vr3 according to the magnification information D41. Moreover, the comparator 430 receives the integration signal Vg3 and the reference signal Vr3 and generates accordingly a comparison signal Vc4. Furthermore, the signal converter 440 determines the magnification information D41 by referring to the comparison signal Vc4 and gradually adjusts the magnification information D41 through binary successive approximation. Hence, the signal generator 450 is able to gradually adjust the reference signal Vr3 to the integration signal Vg3 according to the magnification information D41. Furthermore, when the reference signal Vr3 and the integration signal Vg3 are equal, the signal converter 440 stops adjusting the magnification information D41. Therefore, the signal converter 440 is able to transmit the control information D31 to the current mapping unit 320, and is able to update the control information D31 by the magnification information D41 when the reference signal Vr3 and the integration signal Vg3 are equal.

Figure 5:
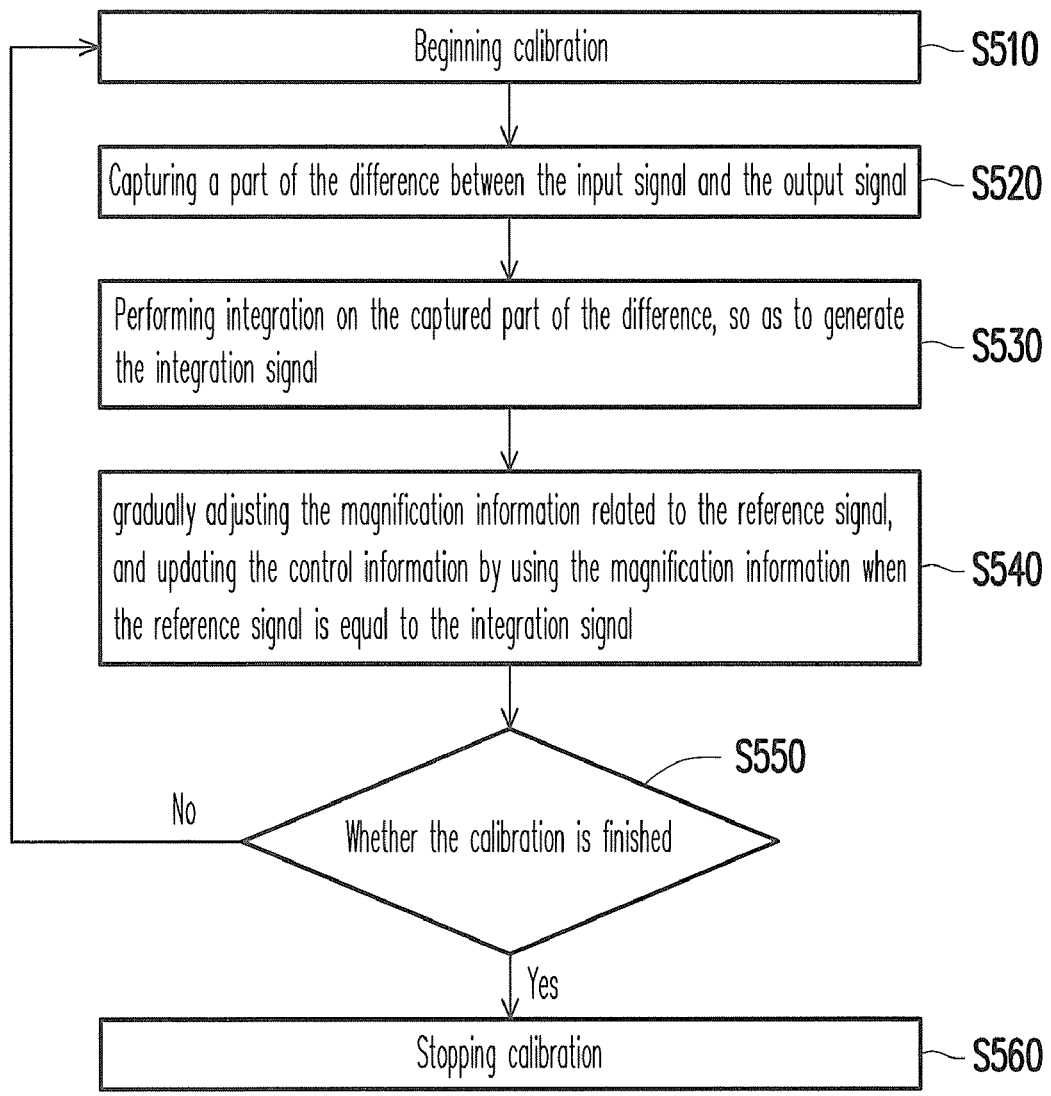
FIG. 5 is a schematic operational flowchart for illustrating the signal detection unit and the magnification control unit.

For example, FIG. 5 is a schematic operational flowchart for illustrating the signal detection unit and the magnification control unit. As shown in FIG. 5, in the beginning, in step S510 and in a first time interval, the switch 422 in the signal detection unit 330 is turned on, so as to begin calibration of the output impedance. In addition, as shown in step S520, the signal detection unit 330 at this moment captures a part of the difference between the input signal Vin3 and the output signal Vo3. As shown in step S530, the signal detection unit 330 performs integration on the captured part of the difference, so as to generate the integration signal Vg3. It should be noted that during the period that the switch 422 is turned on, i.e. in the first time interval, the magnification control unit 340 does not adjust the reference signal Vr3.

Figure 6:
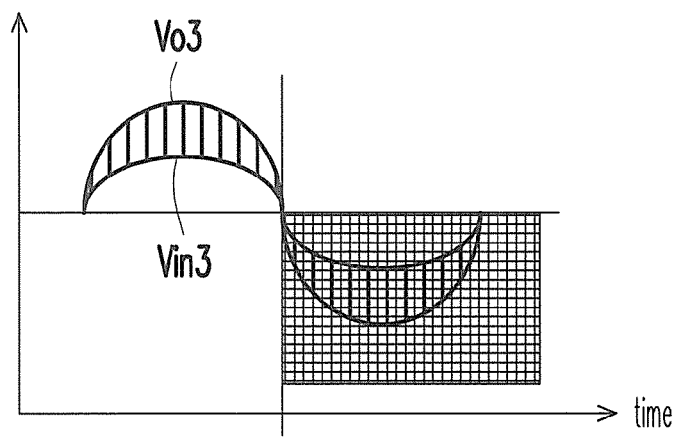
FIG. 6 is a timing diagram of an input signal and an output signal according to an embodiment of the disclosure.

For example, FIG. 6 is a timing diagram of the input signal and the output signal according to an embodiment of the disclosure. As shown in FIG. 6, the input signal Vin3 and the output signal Vo3 are, for example, sine waves, and the two signals Vin3 and Vo3 have the same direct-current voltage. Furthermore, the amplitude of the output signal Vo3 is greater than the amplitude of the input signal Vin3. Therefore, during a first half of a period of the signal, an absolute value of the output signal Vo3 is greater than the input signal Vin3, and the obtained integration signal Vg3 is positive. On the other hand, during a second half of the period of the signal, the absolute value of the output signal Vo3 is less than the input signal Vin3, and the obtained integration signal Vg3 is negative. Therefore, if all the signals in the first and second halves of the period are integrated, the integration signal Vg3 will be 0, making the system unable to adjust the output impedance Ro3.

In order to prevent the above from happening, according to the present embodiment, the signal capturer 410 masks the input signal Vin3 and the output signal Vo3 in the second half of the period and captures the input signal Vin3 and the output signal Vo3 in the first half of the period, so as to be used as the input segment signal DV41 and the output segment signal DV42. Afterwards, the difference integration circuit 420 performs integration on the difference between the input segment signal DV41 and the output segment signal DV42. In other words, since the signal detection unit 330 performs integration on a part of the difference between the input signal Vin3 and the output signal Vo3, even if the line driver 300 is applied in a system which has a fixed direct-current voltage, the output impedance Ro3 may still be adaptively adjusted according to changes in the equivalent impedance Zin3.

Still referring to FIG. 5, when the integration signal Vg3 is obtained, as shown in step S540, in a second time interval, the switch 422 in the signal detection unit 330 is turned off, so that the signal detection unit 330 stops performing integration on a part of the difference between the input signal Vin3 and the output signal Vo3 and outputs the integration signal Vg3 to the magnification control unit 340. Moreover, in the second time interval, the magnification control unit 340 gradually adjusts the magnification information D41 related to the reference signal Vr3. Furthermore, when the reference signal Vr3 and the integration signal Vg3 are equal, the magnification control unit 340 uses the magnification information D41 to update the control information D31 that is transmitted to the current mapping unit 320. Next, as shown in step S550, it is determined whether calibration of the output impedance Ro3 should be performed. If calibration of the output impedance Ro3 is to be continued, return to step S510. On the other hand, if calibration of the output impedance Ro3 is to be stopped, proceed to step S560.

Figure 7:
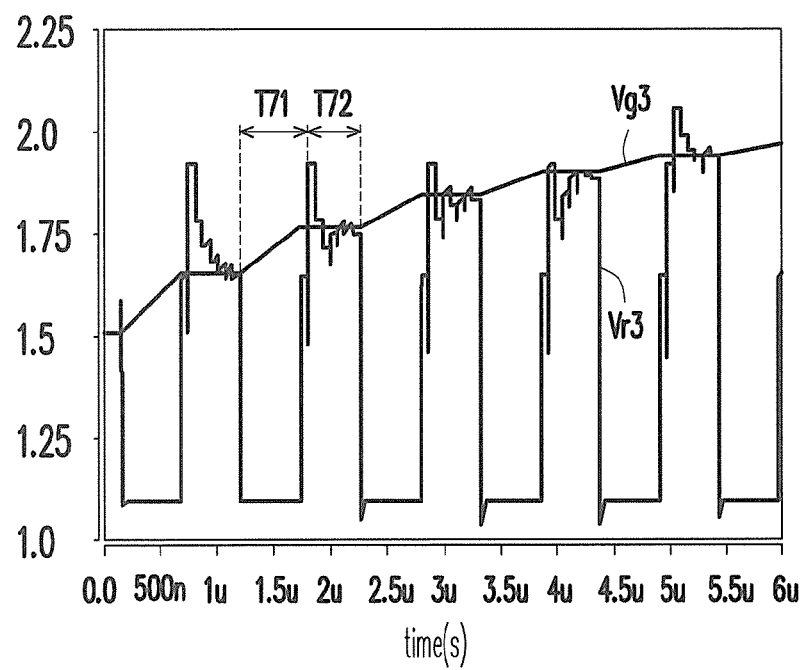
FIG. 7 is a timing diagram of a reference signal and an integration signal according to an embodiment of the disclosure.

For example, FIG. 7 is a timing diagram of the reference signal and the integration signal according to an embodiment of the disclosure. As shown in FIG. 7, in a first time interval T71, the magnification control unit 340 does not adjust the reference signal Vr3. On the other hand, the signal detection unit 330 at this moment performs integration on a part of the difference between the input signal Vin3 and the output signal Vo3, so that the integration signal Vg3 changes with time. Afterwards, in a second time interval T72, the signal detection unit 330 stops performing integration, so that the integration signal is maintained at a certain level. At this moment, the magnification control unit 340 adjusts the integration signal Vg3, so that the reference signal Vr3 is gradually adjusted to the integration signal Vg3. If a recognition result in step S550 is continuing calibration of the output impedance Ro3, as shown in FIG. 7, the signal detection unit 330 adjusts the integration signal Vg3 again, and when the signal detection unit 330 stops performing integration, the magnification control unit 340 adjusts the reference signal Vr3 again.

Figure 8:
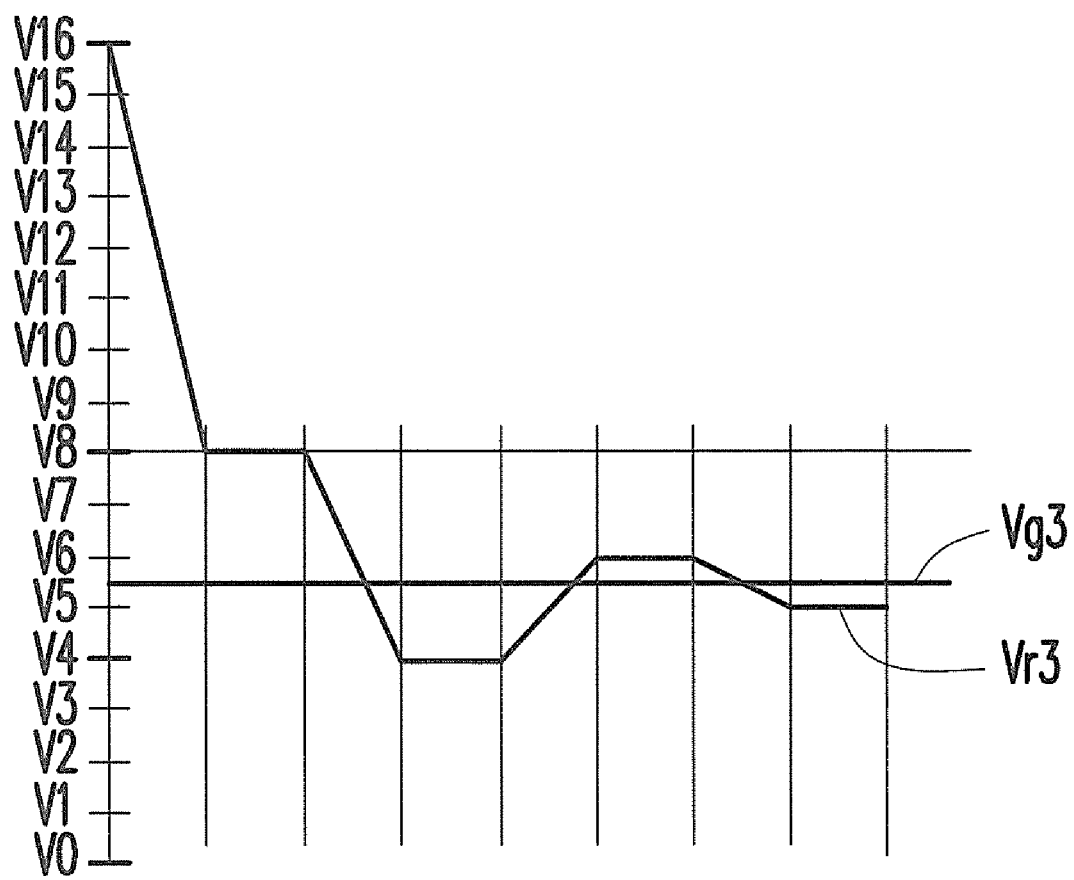
FIG. 8 is a partially magnified view of the timing diagram of FIG. 7.

In further detail, FIG. 8 is a partially magnified view of the timing diagram of FIG. 7, wherein it is assumed that the magnification information D41 includes 4 bits, and a lowest level and a highest level of the reference signal is V0 and V16, respectively. The interval between the levels V0 and V16 is divided into 16 equal portions, wherein the portions, starting from low to high, respectively correspond to a predetermined code (0000) to a predetermined code (1111). In other words, the magnification information is used to determine the value of Vr3. As shown in FIG. 8, when adjusting the reference signal Vr3, since the magnification control unit 340 gradually adjusts the reference signal Vr3 through binary successive approximation, the magnification control unit 340 in the beginning compares the reference signal Vr3 which has the level V8 with the integration signal Vg3. Afterwards, since the reference signal Vr3 which has the level V8 is greater than the integration signal Vg3, the signal converter 440 maintains the first bit of the magnification information D41 at "0," meaning that the magnification information D41 is adjusted to {0000}.

Next, the magnification control unit 340 compares the reference signal Vr3 which has the level V4 with the integration signal Vg3. At this moment, since the reference signal Vr3 which has the level V4 is less than the integration signal Vg3, the signal converter 440 maintains the second bit of the magnification information D41 at "1," meaning that the magnification information D41 is adjusted to {0100}. Next, the magnification control unit 340 compares the reference signal Vr3 which has the level V6 with the integration signal Vg3. At this moment, since the reference signal Vr3 which has the level V6 is greater than the integration signal Vg3, the signal converter 440 maintains the third bit of the magnification information D41 at "0," meaning that the magnification information D41 is adjusted to {0100}.

Afterwards, the magnification control unit 340 compares the reference signal Vr3 which has the level V5 with the integration signal Vg3. At this moment, since the reference signal Vr3 which has the level V5 is less than the integration signal Vg3, the signal converter 440 maintains the fourth bit of the magnification information D41 at "1," meaning that the magnification information D41 is adjusted to {0101}. Moreover, when each of the bits of the magnification information D41 is configured, the magnification control unit 340 determines that the reference signal Vr3 and the integration signal Vg3 are equal, so that the magnification control unit 340 at this moment uses the magnification information D41 which has the bit code of {0101} to update the control information D31, i.e. updating the bit code of the control information D31 to {0101}. By updating the control information, the number of the P channel transistors connected in parallel and inside the current mapping unit is adjusted.

In summary, the instant application uses the control information to adjust the number of the P channel transistors connected in parallel and inside the current mapping unit, so as to change the magnification value of the driving current and the reference current. Therefore, by changing the magnification number, the line driver is able to adaptively adjust the output impedance, thereby achieving impedance matching. Furthermore, since according to the disclosure, adjustment of the current does not require resistors, a greater output signal is permitted. In addition, in terms of controlling the magnification value of the current, according to the disclosure, integration is performed on a part of the difference between the input signal and the output signal, and the magnification value is adjusted according to the integration signal obtained through integration. Therefore, even if applied in a system in which direct-current voltages of signals are fixed, the line driver is still able to adaptively adjust the output impedance according to the equivalent impedance.

It will be apparent to those skilled in the art that various modifications and variations can be made to the disclosure without departing from the scope or spirit of the disclosure. In view of the foregoing, it is intended that the disclosure cover modifications and variations of this disclosure provided they fall within the scope of the following claims and their equivalents.

What is claimed is:

1. A line driver, comprising:
   a current replication unit, replicating a reference current according to an input signal;
   a current mapping unit, electrically connected to the current replication unit and comprising a plurality of first P channel transistors, wherein the current mapping unit adjusts a number of the P channel transistors connected in parallel according to control information, so as to amplify the reference current according to a magnification value and generate a driving current;
   a first resistor, electrically connected between the current replication unit and a direct-current voltage, so as to determine the reference current;
   a second resistor, electrically connected to the current replication unit and the current mapping unit, so as to generate an output signal;
   a signal detection unit, performing integration on a part of a difference between the input signal and the output signal, so as to generate an integration signal; and
   a magnification control unit, generating the control information and gradually adjusting magnification information related to the reference signal so that the reference signal and the integration signal are equal, wherein when the reference signal and the integration signal are equal, the magnification control unit updates the control information by the magnification information.

2. The line driver as claimed in claim 1, wherein the current replication unit comprises:
   an operational amplifier, having a negative input end receiving the input signal; and
   a second P channel transistor, having a source electrically connected to a power source voltage, a gate electrically connected to an output end of the operational amplifier, and a drain electrically connected to a positive input end of the operation amplifier and the first resistor.

3. The line driver as claimed in claim 1, wherein the current mapping unit further comprises:
   a plurality of first switches, wherein a first end of each of the first switches is electrically connected to the current replication unit, a second end of the i-th first switch is electrically connected to a gate of the i-th first P channel transistor, the first switches determine on or off states thereof according to the control information, a source of each of the first P channel transistors is electrically connected to a power source voltage, a drain of each of the first P channel transistors is electrically connected to the second resistor, and i is a positive integer.

4. The line driver as claimed in claim 1, wherein layout areas of the first P channel transistors increase in a power of 2.

5. The line driver as claimed in claim 1, wherein the signal detection unit comprises:
   a signal capturer, capturing a part of the input signal and a part of the output signal and generating an input segment signal and an output segment signal; and
   a difference integration circuit, performing integration on a difference between the input segment signal and the output segment signal in a first time interval, and stopping performing integration and outputting the integrating signal in a second time interval.

6. The line driver as claimed in claim 5, wherein the difference integration circuit comprises:
   an error amplifier, having a positive input end receiving the input segment signal, and a negative input end receiving the output segment signal;
   a second switch, having a first end electrically connected to an output end of the error amplifier and a second end, the second switch turning on the first end and the second end thereof in the first time interval and turning off the first end and the second end thereof in the second time interval; and
   a capacitor, having a first end electrically connected to the second end of the second switch, and a second end electrically connected to a ground voltage.

7. The line driver as claimed in claim 1, wherein the magnification control unit comprises:
   a comparator, receiving the integration signal and the reference signal and generating accordingly a comparison signal;
   a signal generator, electrically connected to the comparator and generating the reference signal according to the magnification information; and
   a signal converter, electrically connected to the comparator and the signal generator and generating the control information, wherein the signal converter determines the magnification information according to the comparison signal and gradually adjusts the magnification information through binary successive approximation, and when the reference signal and the integration signal are equal, the signal converter updates the control information by the magnification information.

8. The line driver as claimed in claim 1, wherein in a first time interval, the signal detection unit performs integration on a part of a difference between the input signal and the output signal, and in a second time interval, the signal detection unit stops performing integration and outputs the integration signal to the magnification control unit.

9. The line driver as claimed in claim 8, wherein in the first time interval, the magnification control unit stops adjusting the reference signal, and in the second time interval, the magnification control unit adjusts the reference signal to the integration signal.

* * * * *